US011285712B2

(12) United States Patent
Theiss, III et al.

(10) Patent No.: US 11,285,712 B2
(45) Date of Patent: Mar. 29, 2022

(54) METHOD OF MAKING A PATTERNED FLEXOGRAPHIC PRINTING PLATE

(71) Applicant: The Procter & Gamble Company, Cincinnati, OH (US)

(72) Inventors: Edward Daniel Theiss, III, Union Township, OH (US); Scott David Hochberg, Cincinnati, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 575 days.

(21) Appl. No.: 15/473,693

(22) Filed: Mar. 30, 2017

(65) Prior Publication Data
US 2017/0291407 A1 Oct. 12, 2017

Related U.S. Application Data

(60) Provisional application No. 62/318,980, filed on Apr. 6, 2016.

(51) Int. Cl.
| | | |
|---|---|---|
| *B41C 1/00* | (2006.01) | |
| *G03F 7/00* | (2006.01) | |
| *B23K 26/361* | (2014.01) | |
| *B23K 26/362* | (2014.01) | |
| *B23K 26/402* | (2014.01) | |
| *B29C 59/02* | (2006.01) | |
| *B29C 59/04* | (2006.01) | |
| *B23K 103/16* | (2006.01) | |
| *B29L 31/00* | (2006.01) | |

(52) U.S. Cl.
CPC ............. *B41C 1/00* (2013.01); *B23K 26/361* (2015.10); *B23K 26/362* (2013.01); *B23K 26/402* (2013.01); *B29C 59/02* (2013.01);

*B29C 59/04* (2013.01); *G03F 7/0002* (2013.01); *B23K 2103/172* (2018.08); *B29L 2031/767* (2013.01)

(58) Field of Classification Search
None
See application file for complete search history.

(56) References Cited

U.S. PATENT DOCUMENTS

| | | | |
|---|---|---|---|
| 3,470,059 A | 9/1969 | Jonnes | |
| 4,079,112 A | 3/1978 | Stransky et al. | |
| 4,095,008 A | 6/1978 | Sundstrom et al. | |
| 4,515,739 A | 5/1985 | Maine | |
| 5,015,556 A * | 5/1991 | Martens | G03F 7/2024 430/284.1 |

(Continued)

FOREIGN PATENT DOCUMENTS

| | | |
|---|---|---|
| CN | 101535893 A | 9/2009 |
| GB | 2451431 A | 2/2009 |
| WO | WO 0130562 A1 | 5/2001 |

OTHER PUBLICATIONS

International Search Report and Written Opinion dated Jun. 28, 2017, 10 pages.

(Continued)

*Primary Examiner* — Joel G Horning
(74) *Attorney, Agent, or Firm* — S. Robert Chuey; Sarah M. DeCristofaro

(57) ABSTRACT

An analog method of making a patterned flexographic printing plate, the method comprising impressing a flexible patterned substrate into an uncured soft photopolymer plate to form the patterned flexographic printing plate.

17 Claims, 12 Drawing Sheets

(56) References Cited

U.S. PATENT DOCUMENTS

| | | |
|---|---|---|
| 7,074,358 B2 | 7/2006 | Gybin et al. |
| 2003/0111771 A1 | 6/2003 | Gybin et al. |
| 2004/0126682 A1 | 7/2004 | Dreher et al. |
| 2007/0070503 A1 | 3/2007 | Boswell et al. |
| 2008/0087181 A1 | 4/2008 | Goichman et al. |
| 2008/0199816 A1* | 8/2008 | Choi .................... G03F 7/0002 430/322 |

OTHER PUBLICATIONS

Hagberg et al., "Effects of Modulus and Surface Chemistry of Thiol-Ene Photopolymers in Nanoimprinting", Polymer Science & Engineering Dept., University of Massachusetts, Nano Lett. vol. 7, No. 2, 2007, pp. 233-237.

Jeon et al., "Molded transparent photopolymers and phase shift optics for fabricating three dimensional nanostructures", 2007 Optical Society of America, May 14, 2007, vol. 15, No. 10 / Optics Express, pp. 6358-6366.

Anonymous, "Central Impression Multi-Layer Deposition & Curing Apparatus and/or process for Depositing Multiple, Often Liquid, Materials upon Web Form Substrates and then Curing Some/All by Curing Energy", Research Disclosure Database No. 628054, published digitally Jul. 19, 2016, www.researchdisclosure.com, 7 pgs.

Anonymous, "Trilayer Film Surface Structure", Research Disclosure Database No. 628055, published digitally Jul. 19, 2016, www.researchdisclosure.com, 6 pgs.

\* cited by examiner

METHOD OF MAKING A PATTERNED FLEXOGRAPHIC PRINTING PLATE

FIELD OF THE INVENTION

The present disclosure relates generally to a method of making a patterned flexographic printing plate, and more specifically to an analog method wherein a flexible patterned substrate is impressed into an uncured soft polymer.

BACKGROUND

Films used in products and packages can benefit from micro-sized patterns. Such patterns can provide various effects such as: optical effects (e.g. lensing, holographics), tactile effects (e.g. perceived softness), and/or functional effects (e.g. surface characteristics). There are a number of different ways to impart micro-sized patterns onto films. A known approach is to use curable coatings and patterning equipment to impart such patterns.

This approach can be employed in several ways. One way is to use a rigid (or semi-rigid) printing plate (e.g. a metal plate) with an etched or engraved relief; however, such plates can be expensive. Another way is to use a polymer printing plate that is made using selective masking; however selective masking requires precise equipment control and often uses harsh solvents in a wash-out step. Still another way is to use a continuous roll of textured casting film; however, such rolls require a separate web-handling apparatus and the rolls must be regularly replaced. Thus, there are drawbacks to these ways to impart micro-sized patterns to films.

SUMMARY

However, embodiments of the present disclosure can be used to economically impart micro-sized patterns to films, without the need for a separate web-handling apparatus. A flexible patterned substrate can be pressed into an uncured soft photopolymer plate to form a patterned flexographic printing plate, which can be used to impart micro-sized patterns into curable coatings on films. This analog impression process does not require precise equipment control or the use of a wash-out step. In some embodiments, the substrate can be a commercially available film, and the plate can begin as a commercially available blank, so the plate can be inexpensive to make. The resulting flexographic printing plate can be used with commercially available coatings, on conventional flexographic equipment, and can last for many thousands of cycles, so the plate is also easy and inexpensive to use. The flexographic printing plate can be used to print micro-sized patterns on products and packages, wherein such patterns can provide various effects including optical effects, tactile effects, and/or functional effects.

DETAILED DESCRIPTION OF THE INVENTION

Figure 1:
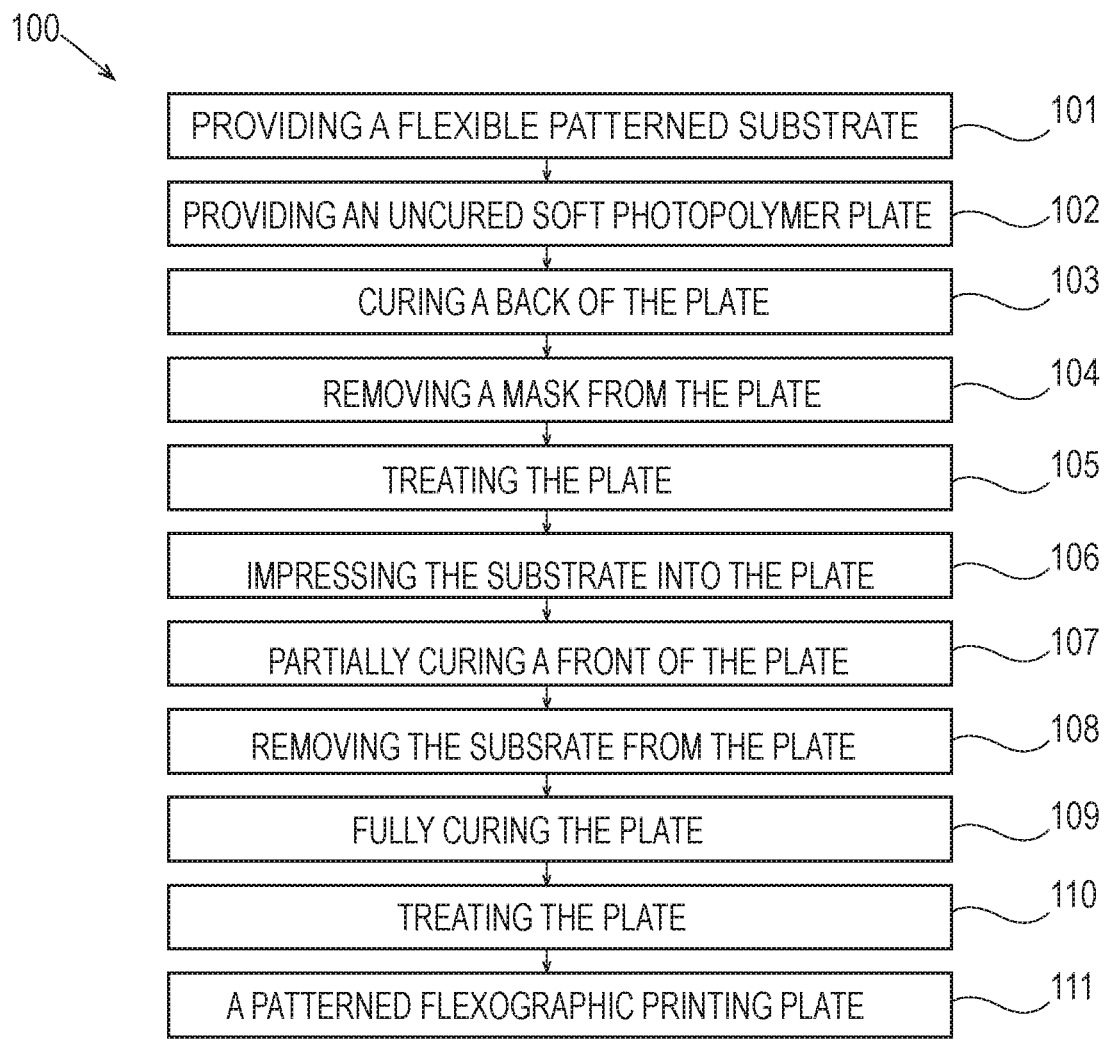
FIG. 1 is a flowchart that illustrates the steps in the method.

FIG. 1 is a flowchart that illustrates steps in the method 100 of making a patterned flexographic printing plate, according to embodiments of the present disclosure. Step 101 includes providing a flexible patterned substrate, as described in connection with FIG. 2A. Step 102 includes providing an uncured soft photopolymer plate, as described in connection with FIG. 2B. Step 103 includes curing a side of the plate, as described in connection with FIG. 2C. Step 104 includes removing a mask from the plate, as described in connection with FIG. 2D. Step 105 includes treating the plate, as described in connection with FIG. 2E. Step 106 includes impressing the substrate into the plate, as described in connection with FIGS. 2F and 2G. Step 107 includes partially curing a side of the plate, as described in connection with FIG. 2H. Step 108 includes removing the substrate from the plate, as described in connection with FIG. 2I. Step 109 includes fully curing the plate, as described in connection with FIG. 2J. Step 110 includes treating the plate, as described in connection with FIG. 2K. Result 111 is the patterned flexographic printing plate resulting from the method 100.

In various embodiments of the method 100, any of the steps may be performed as a number of partial steps, and/or any of the steps may be modified in any way known in the art, and/or one or more of the steps may be omitted, and/or one or more additional steps may be added, and/or one or more of the steps may overlap in time, and/or one or more of the steps may be performed at the same time, and/or one or more of the steps may be performed at different times, and/or one or more of the steps may be performed in a different order, and one or more of any of these alternative embodiments may be combined in any workable combination.

Figure 2A:
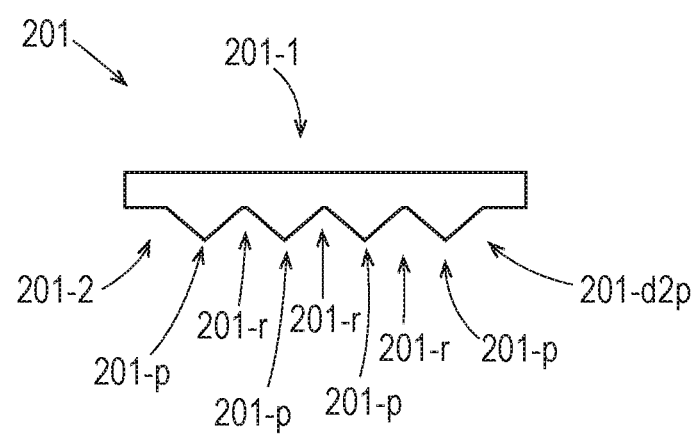
FIG. 2A illustrates a flexible patterned substrate.

FIG. 2A illustrates an end view of a flexible patterned substrate 201 having a first side 201-1, which is a major surface, and a second side 201-2, which is a major surface, wherein the second side is considered to be a patterned major surface, since at least part of the second side 201-2 includes relief features, which are protrusions 201-p and recesses 201-r, having a height (measured perpendicular to the substrate from the deepest recess to the tallest protrusion) of 50 nanometers to 150 micrometers, wherein the protrusions 201-p and the recesses 201-r all together form an exemplary pattern 201-a2p, which serves as the master pattern for the flexographic printing plate being made in the method 100 of FIG. 1; in various embodiments, a pattern on a substrate can have relief features that include any number of protrusions and/or recesses, of any kind, of any shape, of any aspect ratio, having any distribution known in the art, with any of these configurations variable in any way, so long as the pattern has a height from 50 nanometers to 150 micrometers, such as 50 nanometers to 75 micrometers, 50 nanometers to 37 micrometers, 50 nanometers to 15 micrometers, 50 nanometers to 7 micrometers, 37 to 75 micrometers, 7 to 15 micrometers, 7 to 150 micrometers, 15 to 150 micrometers, 37 to 150 micrometers, or 75 to 150 micrometers, or any range formed by any combination of any of the preceding values.

A flexible patterned substrate may be commercially purchased in the form a flexible patterned film, such as a CAST AND CURE holographic film available from Breit Technologies of Overland Park, Kans., United States; however, a flexible patterned substrate can be any suitable material that is a flexible material (e.g. a thin, pliable, sheet-like material) and that has pattern of relief features having a height as described herein, and that can be processed according to the method 100 of FIG. 1; examples of flexible patterned substrates include: textured paper, fabric, micro-embossed film, optical lens film. However, it is also contemplated that a patterned substrate may be a rigid patterned substrate, such as a metal sheet, a molded plastic sheet, a silicon wafer, etc.

Figure 2B:
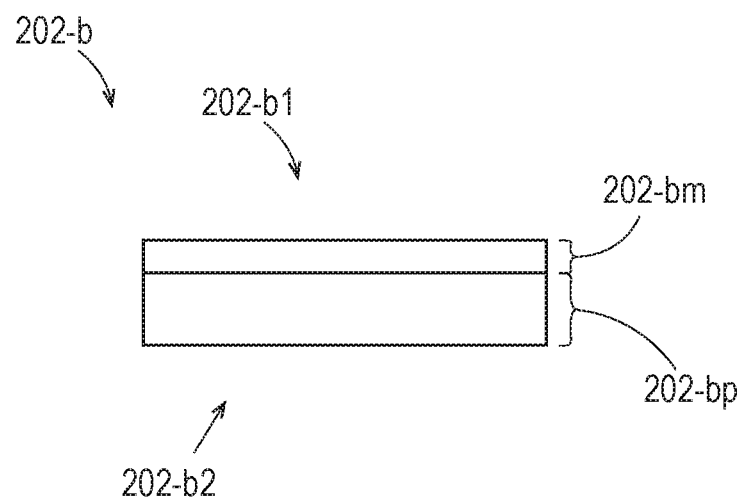
FIG. 2B illustrates an uncured soft photopolymer plate.

FIG. 2B illustrates an end view of an uncured soft photopolymer plate 202-b having a first side 202-b1, which is a major surface, and a second side 202-b2, which is a major surface, wherein a protective mask 202-bm is disposed on at least part of the first side 202-b1, and photopolymer material 202-bp is disposed on at least part of the second side 202-b2; in various embodiments, an uncured soft photopolymer plate can have various overall thicknesses, such as an overall thickness from 0.1 millimeters to 10.0 millimeters, or an overall thickness of any increment of 0.1 millimeters between 0.1 millimeters and 10.0 millimeters, or any range formed by any of these thickness values; exemplary overall thicknesses include 1.14 millimeters (0.045") and 1.70 millimeters (0.067"); in alternative embodiments, an uncured soft photopolymer plate may not have a mask.

An uncured soft photopolymer may be commercially purchased in the form of a flexographic plate (with and without a mask layer), such as: CYREL FAST (e.g. types DFUV, DFR, DFM, and DFP) flexographic plates available from DuPont of Wilmington, Del., United States or flexographic plates such as types UVR, MAX, and MVP available from MacDermid, Inc. of Morristown, Tenn., United States; or an uncured soft photopolymer plate may be made from one or more suitable materials (such as mixtures of monomers, oligomers, and/or photoinitiators; common forms include acrylates and silicones) that are curable into a hardened state by exposure to visible and/or ultraviolet light, as known in the art.

Figure 2C:
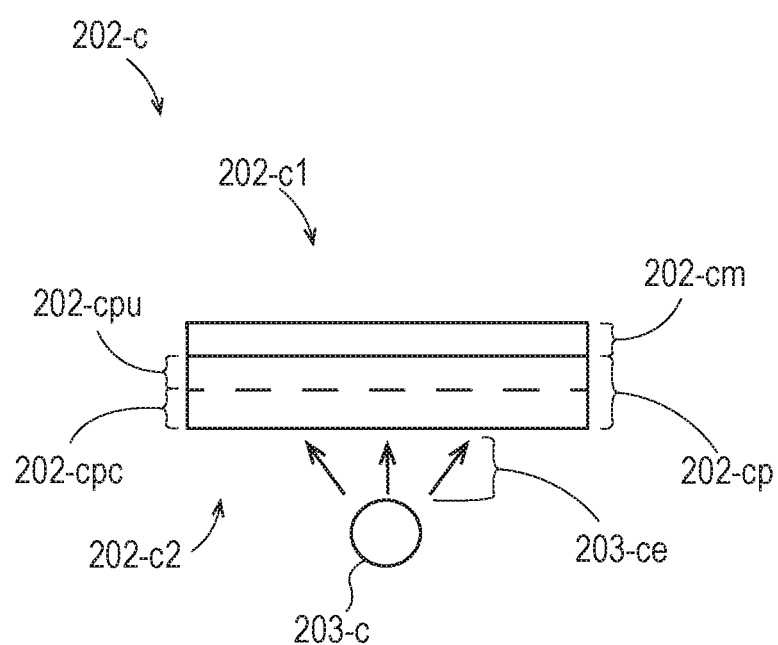
FIG. 2C illustrates a step of curing a side of the plate.

FIG. 2C illustrates an end view of a step of curing a side of the plate 202-c, which is the same as the plate 202-b of FIG. 2B, with like-numbered elements configured in the same way, except as described below, wherein a curing source 203-c, such as an ultraviolet light or an electron-beam emitter, emits curing energy 203-ce (e.g. heat and/or light), which at least partially cures at least part of at least an outer portion of the photopolymer material 202-cp, such that the photopolymer material 202-cp has a cured portion 202-cpc and an uncured portion 202-cpu; in various embodiments, part, parts, or all of an outer portion of the photopolymer material may be partially or fully cured, by one or more curing sources, in order to create a floor structure within the plate; however, in alternative embodiments, a floor may not be created. As an example, a curing source (for use with any curing step disclosed herein) may be a DeGraf Concept 400 ECLF plate curing system (available from GLUNZ & JENSEN of Ringsted, Denmark).

Figure 2D:
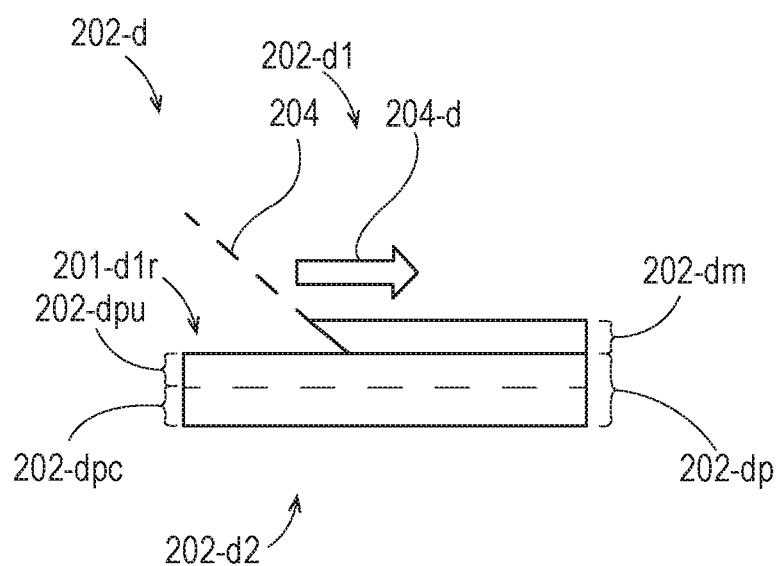
FIG. 2D illustrates a step of removing a mask from the plate.

FIG. 2D illustrates an end view of a step of removing the mask 202-dm from the plate 202-d, which is the same as the plate 202-c of FIG. 2C, with like-numbered elements configured in the same way, except as described below, wherein a removal process 204 (such as laser ablation) is shown moving 204-d across the first side 202-d1, and exposing an unmasked area 201-d1r on a surface of the uncured portion 202-dpu of the photopolymer material 202-dp, to prepare the plate 202-d for subsequent treating and/or impressing, as described below, wherein in the embodiment of FIG. 2D all of the mask is removed, such that all of the first side 202-d1 becomes an unmasked area; in various embodiments, part, parts, or all of a protective mask may be removed; in various embodiments the unmasked area may be continuous or discontinuous; in alternative embodiments without a protective mask, this step of removing a mask may be omitted. As an example, a mask may be ablated using a CDI Spark 4835 Inline UV Digital Flexo image setter (available from ESKO of Ghent, Belgium).

Figure 2E:
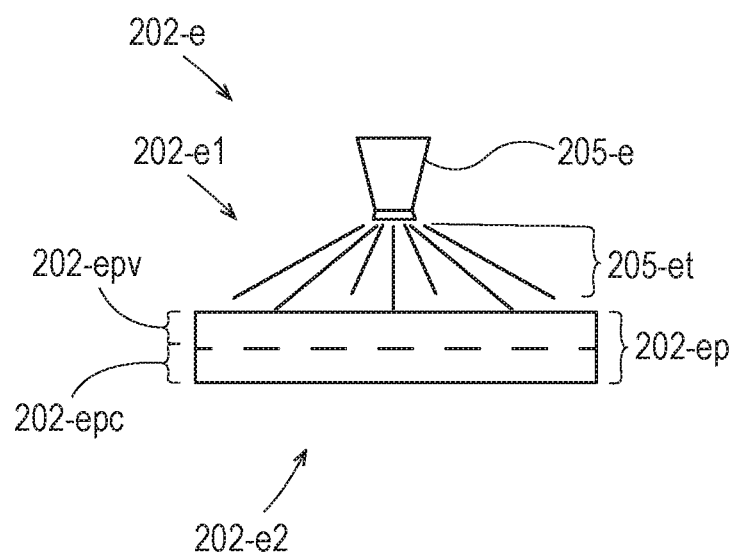
FIG. 2E illustrates a step of treating the plate.

FIG. 2E illustrates an end view of a step of treating the plate 202-e, which is the same as the plate 202-d of FIG. 2D, with like-numbered elements configured in the same way, except as described below, wherein a treating source 205-e, such as a spray nozzle, a doctor blade, or a draw down rod provides a treatment 205-et, which at least partially treats at least part of at least an outer portion of the uncured portion 202-epu of the plate 202-e to improve its ability to release a surface after contact. An example of said treating is spraying a thin silicone coating; in various embodiments, on part, on parts, or on all of an outer portion of the uncured portion of the plate. The uncured portion may be partially or fully treated, using any kind of way to improve releasability, known in the art; however, in alternative embodiments, this step of treating may be omitted. An example of an embodiment with the releasing treatment step omitted is using a flexographic plate in a commercially available form with a lower surface energy for improved releasability.

Figure 2F:
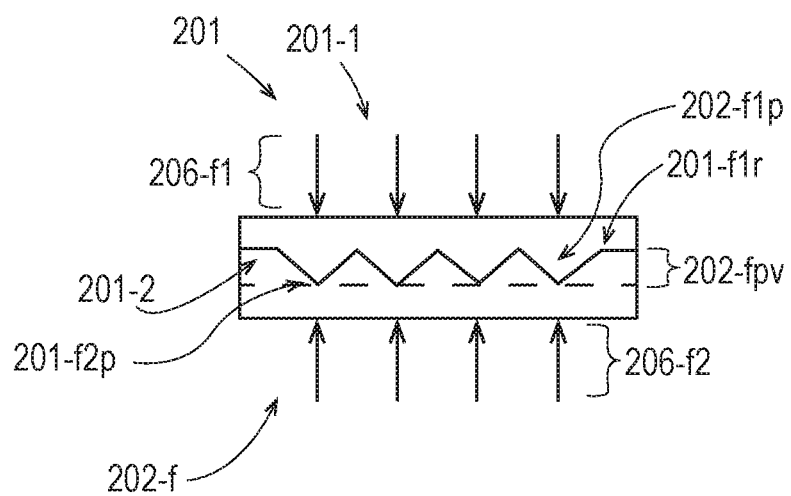
FIG. 2F illustrates a step of impressing the substrate into the plate.

FIG. 2F illustrates an end view of a step of impressing the flexible patterned substrate 201 of FIG. 2A into an exposed surface of the uncured portion 202-fpu of the soft photopolymer plate 202-f, which is the same as the plate 202-e of FIG. 2E, with like-numbered elements configured in the same way, except as described below, wherein distributions of opposing inward forces 206-f1 and 206-f2 provide pressure that presses the substrate 201 and the plate 202-f against each other, such that the pattern 201-f2p of the substrate 201 is imparted to the plate 202-f and the protrusions and recesses of the pattern 201-f2p shape at least an outer portion of the uncured portion 202-fpu into a pattern 202-f1p of that plate 202-f that is an inverse of the pattern 201-f2p, wherein the protrusions and recesses of relief features of the substrate 201 become recesses and protrusions of relief features on the plate 202-f, respectively; wherein the opposed inward forces can be provided by various kinds of mechanical apparatus known in the art, including, for example, the pressure rollers of FIG. 2G; in various embodiments, part, parts, or all of an outer portion of an uncured portion may be impressed one or more times, with one or more flexible patterned substrates, using any kind of suitable mechanical apparatus; in alternative embodiments, a method of making a patterned flexographic printing plate may also include applying heat (e.g. by a heater that provides conduction, convection, and/or radiation) to further soften the soft photopolymer plate before and/or during the step of impressing.

Figure 2G:
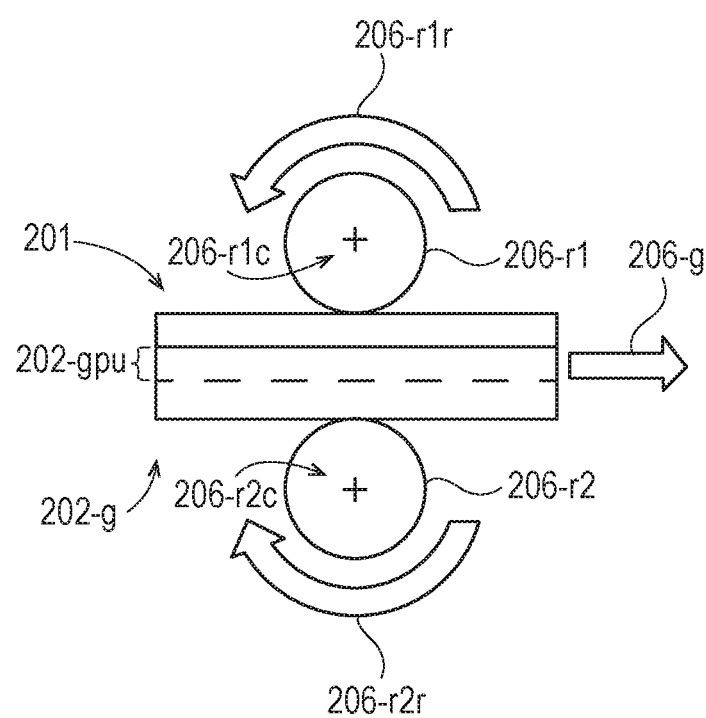
FIG. 2G illustrates another step of impressing the substrate into the plate.

FIG. 2G illustrates a side view of a portion of a mechanical apparatus that can be used in the step of impressing the flexible patterned substrate 201 of FIG. 2A into an exposed surface of the uncured portion 202-gpu of the soft photopolymer plate 202-g, which is the same as the plate 202-f of FIG. 2F, with like-numbered elements configured in the same way, except as described below, wherein a first roller 206-r1 rotates 206-r1r counterclockwise around a first axis 206-r1c and a second roller 206-r2 rotates 206-r2r clockwise around a second axis 206-r2c, and the rollers 20641 and 206-r2 together provide distributions of opposing inward forces that press the substrate 201 and the plate 202-g against each other, between the rollers 20641 and 206-r2, such that the pattern of the substrate 201 is imparted to the plate 202-f, as the substrate 201 and the plate 202-g passes through 206-g between the rollers 20641 and 206-r2; wherein the pair of rollers can be provided by a (heated or unheated) roll laminating machine, as known in the art, including, for example, LUX Laminator Model 62 Pro S available from MacDermid, Inc. of Morristown, Tenn., United States; in various embodiments, a substrate and plate may be passed through one or more pairs of such rollers, one or more times, with or without a carrier sheet on either or both sides; in alternative embodiments, other kinds of laminating machines or presses (with or without rollers), as known in the art, may be used.

Figure 2H:
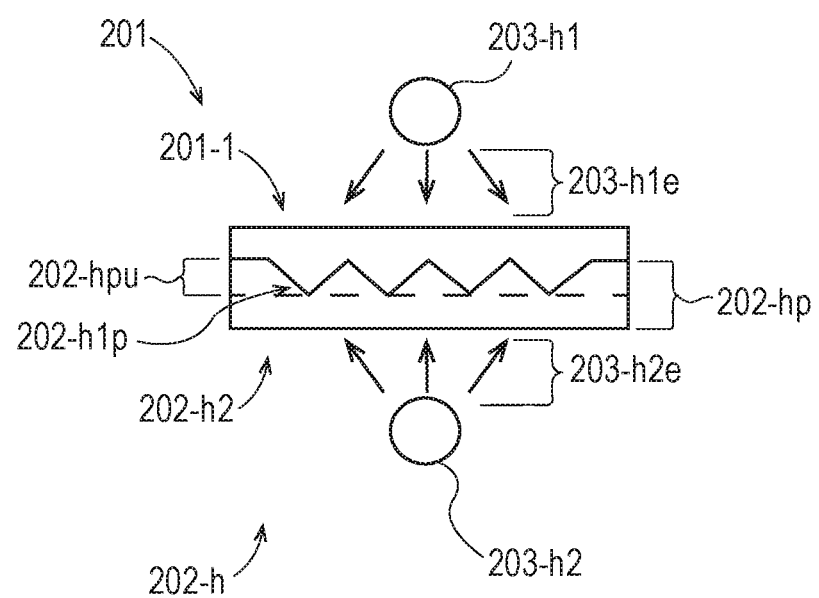
FIG. 2H illustrates a step of partially curing a side of the plate.

FIG. 2H illustrates an end view of a step of partially curing a side of the plate 202-h, which is the same as the plate 202-f of FIG. 2F, with like-numbered elements configured in the same way, except as described below, while the plate 202-h is still in contact with the flexible patterned substrate 201 of FIG. 2A, from the impressing step of FIGS. 2F and/or 2G, wherein a first curing source 203-h1 located outside of the first side 201-1 of the substrate 201 emits curing energy 203-h1e that travels through the substrate 201 (which has material properties (e.g. translucence) that allow transmission of the curing energy) and at least partially cures at least part of at least a portion of the uncured portion 202-hpu of the photopolymer material 202-hp, and wherein a second curing source 203-h2 located outside of the second side 202-h2 of the plate 202-h emits curing energy 203-h2e that travels through the plate 202-h (which has material properties (e.g. translucence) that allow transmission of the curing energy) and at least partially cures at least part of at least a portion of the uncured portion 202-hpu of the photopolymer material 202-hp, such that the uncured portion 202-hpu becomes at least partially cured, which allows the substrate 201 to be more easily removed from plate 202-h without distorting or damaging the pattern 202-h1p formed on the plate 202-h; in various embodiments, part, parts, or all of a one or more portions of the photopolymer material may be partially cured, by one or more curing sources, in order to allow for removal of the plate; in some alternative embodiments, one or more curing sources may be used on only one side; in other alternative embodiments, this step of partial curing may be replaced by a step of full curing; in yet other alternative embodiments, this step of partial curing before removal of the substrate may be omitted. Typically, curing energy falls within the UV spectrum, such as UV-A (315-400 nanometer wavelengths), UV-B (280-315 nanometer wavelengths), and UV-C (100-280 nanometer wavelengths), and can be provided by various sources such mercury bulbs or LED fixtures configured to provide such frequencies.

Figure 2I:
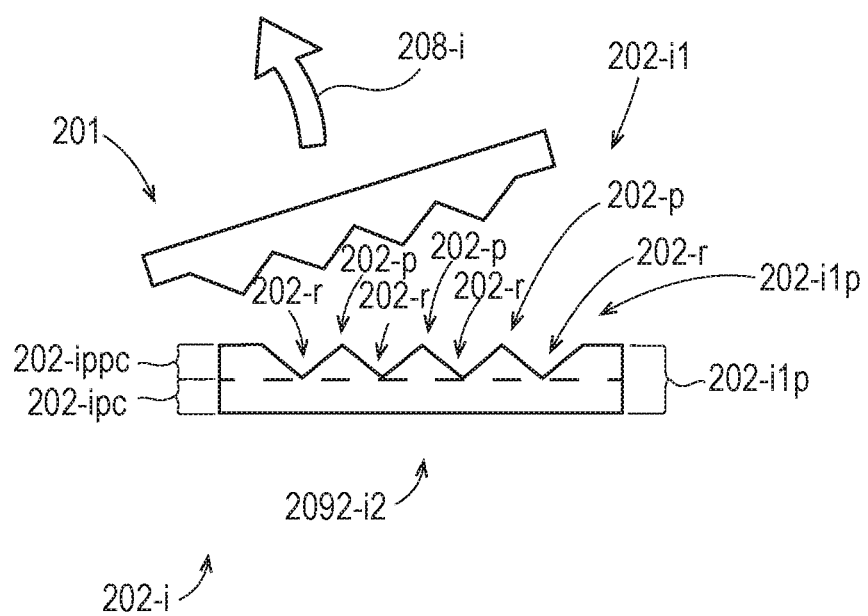
FIG. 2I illustrates a step of removing the substrate from the plate.

FIG. 2I illustrates an end view of a side of the plate 202-i, which is the same as the plate 202-h of FIG. 2H, with like-numbered elements configured in the same way, except as described below, wherein the flexible patterned substrate 201 of FIG. 2A is being removed 208-i from the plate 201, (e.g. by pulling/peeling away), leaving the plate 202-i, which has a first side 202-i1 and a second side 202-i2, wherein the photopolymer material 202-ip of the plate 202-i has a cured portion 202-ipc disposed on the second side 202-i2 and a partially cured portion 202-ippc disposed on the first side 202-i1, and at least part of the first side 202-i1 includes protrusions 202-p and recesses 202-r, which all together form an exemplary pattern 202-i1p, which is the imparted pattern on the flexographic printing plate being made in the method 100 of FIG. 1; in various embodiments, a pattern on a plate can have any number of protrusions and/or recesses, of any kind, of any shape, of any aspect ratio, having any distribution known in the art, with any of these configurations variable in any way, and having any height (measured perpendicular to the plate from the deepest recess to the tallest protrusion) imparted by a master pattern, such as a height from 50 nanometers to 150 micrometers, such as 50 nanometers to 75 micrometers, 50 nanometers to 37 micrometers, 50 nanometers to 15 micrometers, 50 nanometers to 7 micrometers, 37 to 75 micrometers, 7 to 15 micrometers, 7 to 150 micrometers, 15 to 150 micrometers, 37 to 150 micrometers, or 75 to 150 micrometers, or any range formed by any combination of any of the preceding values; in alternative embodiments wherein the step of partial curing is replaced by a step of full curing, the partially cured portion is a fully cured portion in subsequent steps; in other alternative embodiments, wherein the step of partial curing is omitted, the partially cured portion is an uncured portion in subsequent steps.

Figure 2J:
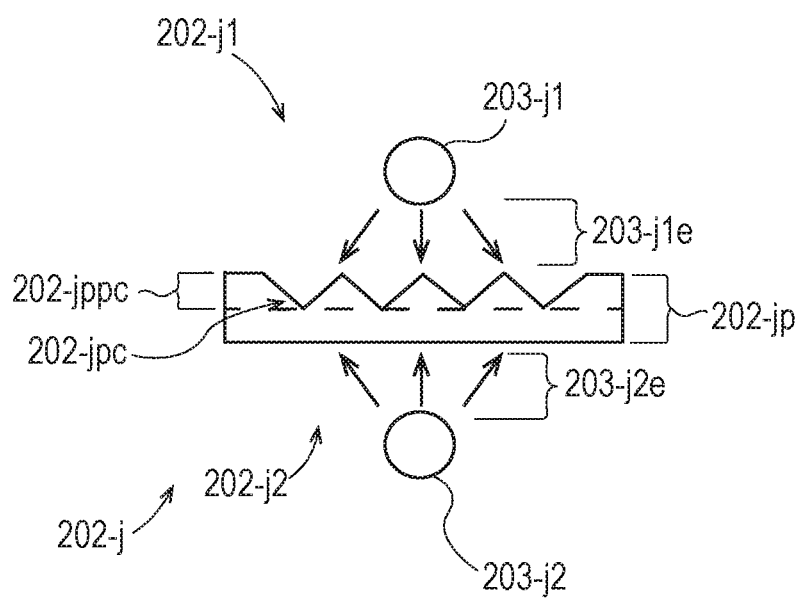
FIG. 2J illustrates a step of fully curing the plate.

FIG. 2J illustrates an end view of a step of fully curing the photopolymer material 202-jp of the plate 202-j, which is the same as the plate 202-i of FIG. 2I, (the plate resulting from the step of FIG. 2I may be used in the step of FIG. 2J without the need for an intervening step of washing out the partially cured photopolymer material) with like-numbered elements configured in the same way, except as described below, wherein a first curing source 203-j1 located outside of the first side 202-j1 of the plate 202-j emits curing energy 203-j1e that travels to the partially cured portion 202-jppc disposed on the first side 202-j1 and contributes to fully curing that portion of the photopolymer material 202-jp, and wherein a second curing source 203-j2 located outside of the second side 202-j2 of the plate 202-j emits curing energy 203-j2e that travels through the cured portion 202-jpc disposed on the second side 202-j2 of the plate 202-j (which has material properties (e.g. translucence) that allow transmission of the curing energy) and contributes to fully curing that portion of the photopolymer material 202-jp, such that the partially cured portion 202-jppc becomes fully cured, which finally cures the pattern 202-j1p formed on the plate 202-j and further prepares the plate 202-j for end use; in various embodiments, part, parts, or all of a one or more portions of the photopolymer material may be fully cured by one or more curing sources, in order to finally cure the pattern of the plate; in some alternative embodiments, one or more curing sources may be used on only one side; in other alternative embodiments, wherein the step of partial curing is replaced by a step of full curing, this subsequent step of fully curing the plate may be omitted.

Figure 2K:
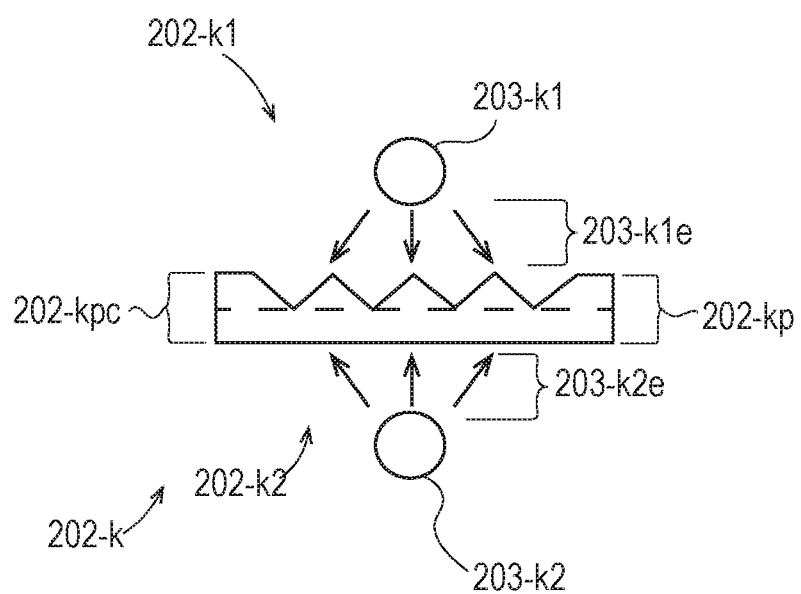
FIG. 2K illustrates a step of treating the plate.

FIG. 2K illustrates an end view of a step of treating the photopolymer material 202-kp of the plate 202-k, which is the same as the plate 202-j of FIG. 2J, with like-numbered elements configured in the same way, except as described below, wherein a first treating source 203-k1 located outside of the first side 202-k1 of the plate 202-k emits detackifying energy 203-k1e that travels to the fully cured material 202-kpc disposed on the first side 202-k1 and contributes to further polymerization of the photopolymer material 202-kp, and wherein a second curing source 203-k2 located outside of the second side 202-k2 of the plate 202-k emits detackifying energy 203-k2e that travels to the fully cured material 202-kpc disposed on the second side 202-k2 and contributes to further polymerization of the photopolymer material 202-*kp*, such that the photopolymer material 202-*kp* becomes fully polymerized, which finally prepares the plate 202-*k* for end use; in various embodiments, part, parts, or all of a one or more portions of the photopolymer material may be treated by one or more treating sources, in order to detackify the material of the plate; in some alternative embodiments, one or more treating sources may be used on only one side; in other alternative embodiments, a cured photopolymer plate may be detackified in any other way known in the art, for example by immersing the plate in one or more chemical solutions (such as a halogen solution); in yet other alternative embodiments, this treatment step for detackifying the plate may be omitted. Typically, detackifying energy falls within the UV-C spectrum (100-280 nanometer wavelengths).

Thus, as described above, embodiments of the present disclosure can be used to economically impart micro-sized patterns to films, without the need for a separate web-handling apparatus. A flexible patterned substrate can be pressed into an uncured soft photopolymer plate to form a patterned flexographic printing plate, which can be used to impart micro-sized patterns into curable coatings on films. This analog impression process does not require precise equipment control or the use of a wash-out step. In some embodiments, the substrate can be a commercially available film, and the plate can begin as a commercially available blank, so the plate can be inexpensive to make. The resulting flexographic printing plate can be used with commercially available coatings, on conventional flexographic equipment, and can last for many thousands of cycles, so the plate is also easy and inexpensive to use. The flexographic printing plate can be used to print micro-sized patterns on products and packages, wherein such patterns can provide various effects including optical effects, tactile effects, and/or functional effects.

In an another embodiment, a standard flexographic printing plate can be used to print the coating and a second rolling nip point with the patterned flexographic printing plate mounted to it to mold the coating prior to curing.

The present disclosure particularly contemplates the embodiments set forth in the following paragraphs A through F:

A. The method 100 of FIG. 1, wherein step 104 is omitted.
B. The method 100 of FIG. 1, wherein step 105 is omitted.
C. The method 100 of FIG. 1, wherein step 107 is omitted.
D. The method 100 of FIG. 1, wherein step 109 is omitted.
E. The method 100 of FIG. 1, wherein step 110 is omitted.
F. The method of any of paragraphs A-E, in any workable combination.

As used herein, the term "like-numbered" refers to similar alphanumeric labels for corresponding elements, as described below. Like-numbered elements have labels with the same last two digits; for example, one element with a label ending in the digits 20 and another element with a label ending in the digits 20 are like-numbered. Like-numbered elements can have labels with a differing first digit, wherein that first digit matches the number for its figure; as an example, an element of FIG. 3 labeled 320 and an element of FIG. 4 labeled 420 are like-numbered. Like-numbered elements can have labels with a suffix (i.e. the portion of the label following the dash symbol) that is the same or possibly different (e.g. corresponding with a particular embodiment); for example, a first embodiment of an element in FIG. 3A labeled 320-*a* and a second embodiment of an element in FIG. 3B labeled 320-*b*, are like numbered.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An analog method of making a patterned flexographic printing plate, the method comprising:
    providing a flexible patterned substrate having at least one protrusion or recess comprising a patterned major surface;
    providing an uncured soft photopolymer plate comprising a first side and a second side, wherein the first side is opposite the second side;
    curing a second side of the photopolymer plate to form a cured, second side of the photopolymer plate and an uncured, first side of the photopolymer plate;
    impressing the patterned major surface of the flexible patterned substrate into an uncured, first side of the photopolymer plate;
    partially curing the first side of the photopolymer plate through the flexible patterned substrate to form a partially cured first side of the photopolymer plate, wherein the flexible patterned substrate does not prevent energy for curing from reaching the first side of the photopolymer plate;
    removing the flexible patterned substrate from the partially cured first side of the photopolymer plate;
    fully curing the partially cured first side of the photopolymer plate to form the patterned flexographic printing plate including a patterned major surface, wherein the patterned major surface of the patterned flexographic printing plate comprises relief features having a height of 50 nanometers to 150 micrometers;
    removing by laser ablation at least a portion of a protective mask from the uncured soft photopolymer plate, to form an unmasked area on the uncured soft photopolymer plate; and,
    the impressing includes impressing at least a portion of the flexible patterned substrate into the unmasked area.

2. The method of claim 1, comprising, before the impressing, treating the uncured soft photopolymer plate to improve the releasability of the uncured soft photopolymer plate.

3. The method of claim 1, comprising applying heat to the uncured soft photopolymer plate, before the impressing.

4. The method of claim 1, comprising applying heat to the uncured soft photopolymer plate, during the impressing.

5. The method of claim 1, comprising using pressure to impress the flexible patterned substrate to the uncured soft photopolymer plate.

6. The method of claim 5, comprising passing the substrate and the plate through a pair of pressure rollers.

7. The method of claim 5, comprising passing the substrate and the plate through a heated roll laminating machine.

8. The method of claim 1, wherein the impressing comprises impressing the flexible patterned substrate to create a holographic effect.

9. The method of claim 1, wherein the impressing comprises impressing the flexible patterned substrate to create an optical effect.

10. The method of claim 1, wherein the impressing includes impressing the flexible patterned substrate to create a tactile effect.

11. The method of claim 1, wherein the flexible patterned substrate is translucent to ultraviolet light.

12. The method of claim 1, wherein the partially cured soft photopolymer plate is not washed out when fully curing the partially cured soft photopolymer plate, to form the patterned flexographic printing plate.

13. The method of claim 1, wherein the partial curing includes partially curing the uncured soft photopolymer plate by exposing the uncured soft photopolymer plate to a curing source through the flexible patterned substrate.

14. The method of claim 1, wherein the partial curing includes partially curing the uncured soft photopolymer plate by exposing the first side of the soft photopolymer plate to a curing source.

15. The method of claim 1, wherein curing includes exposing the second side of the soft photopolymer plate to the curing source.

16. The method of claim 1, including, after the full curing, treating the patterned flexographic printing plate to reduce a surface energy on the patterned major surface.

17. The method of claim 1, wherein the patterned major surface of the patterned flexographic printing plate includes relief features having a height of 30 to 100 micrometers.

* * * * *